United States Patent [19]

Pinch et al.

[11] 4,060,471
[45] Nov. 29, 1977

[54] COMPOSITE SPUTTERING METHOD

[75] Inventors: Harry Louis Pinch, Princeton, N.J.; Herbert Irwin Moss, Yardley, Pa.

[73] Assignee: RCA Corporation, New York, N.Y.

[21] Appl. No.: 724,220

[22] Filed: Sept. 17, 1976

Related U.S. Application Data

[62] Division of Ser. No. 578,899, May 19, 1975, Pat. No. 4,013,830.

[51] Int. Cl.² ............................................. C23C 15/00
[52] U.S. Cl. ........................... 204/192 SP; 204/192 F; 29/630 E
[58] Field of Search ............... 204/192, 298; 427/103, 427/248 B, 248 G, 251; 178/6.6 R, 6.6 A, 6.6 DD; 179/100.1 B, 100.4 R, 100.4 M, 100.41 G; 274/38; 29/630 E

[56] References Cited

U.S. PATENT DOCUMENTS

| | | | |
|---|---|---|---|
| 3,324,019 | 6/1967 | Laegrid et al. | 204/192 |
| 3,460,976 | 8/1969 | Allen | 427/251 X |
| 3,864,239 | 2/1975 | Fletcher et al. | 204/298 |
| 3,920,533 | 11/1975 | Pompei | 204/192 |
| 3,945,902 | 3/1976 | Hawrylo et al. | 204/192 |
| 3,945,903 | 3/1976 | Svendor et al. | 204/192 |
| 3,985,635 | 10/1976 | Adam et al. | 204/298 |

FOREIGN PATENT DOCUMENTS

| | | | |
|---|---|---|---|
| 830,392 | 3/1960 | United Kingdom | 204/192 SP |

Primary Examiner—John H. Mack
Assistant Examiner—Aaron Weisstuch
Attorney, Agent, or Firm—Glenn H. Bruestle; George E. Haas

[57] ABSTRACT

A method for depositing a layer in which the concentration of constituent materials varies through its thickness employs a radio frequency sputtering apparatus. The deposition apparatus has a target composed of different component materials for the layer. The substrate is placed within the deposition apparatus and moved to various positions with respect to the target during the deposition.

7 Claims, 4 Drawing Figures

COMPOSITE SPUTTERING METHOD

This is a division of application Ser. No. 578,899, filed May 19, 1975 now U.S. Pat. No. 4,013,830 issued on Mar. 22, 1977.

BACKGROUND OF THE INVENTION

This invention relates generally to video disc playback styli and particularly to such styli having a coated electrode for capacitive pickup video disc systems.

Video disc playback systems of a variable capacitance type are disclosed in U.S. Pat. No. 3,842,194 issued on Oct. 15, 1974 to Jon K. Clemens. Also disclosed in that patent and shown in FIG. 5 thereof is a stylus for playing back the recorded information. The disclosed stylus has a sapphire mounting structure with a conducting element deposited on one surface.

Difficulty is often encountered when the conducting element is deposited on the sapphire mounting structure. A metal film is often used as the conducting element. However, many desirable metal films have poor adherence to a polished sapphire surface. For example, it is difficult to deposit sufficiently adherent tungsten, hafnium or chromium films onto such a surface.

SUMMARY OF THE INVENTION

A layer having a concentration of constituent materials which varies through the thickness of the layer may be deposited in a sputtering apparatus having a plurality of sources of different component materials for the layer. During the deposition the substrate upon which the layer is to be deposited is moved to various positions with respect to the sources. The concentration of constituent materials which are deposited at the various positions varies so that the material deposited as the layer has a varying concentration.

DESCRIPTION OF THE INVENTION

Figure 1:
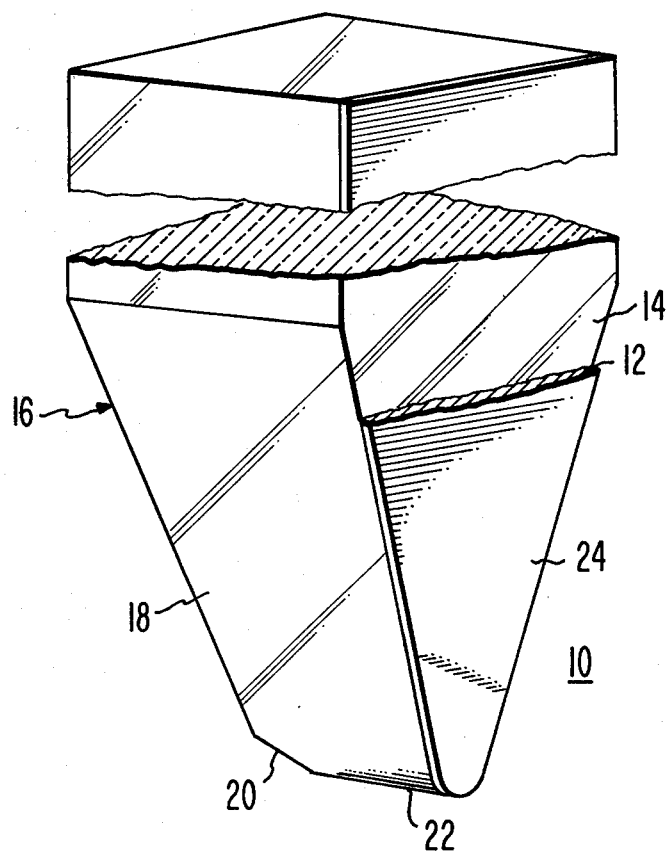
FIG. 1 is a perspective view, partially broken away, of a tip of a playback stylus.
Figure 2:
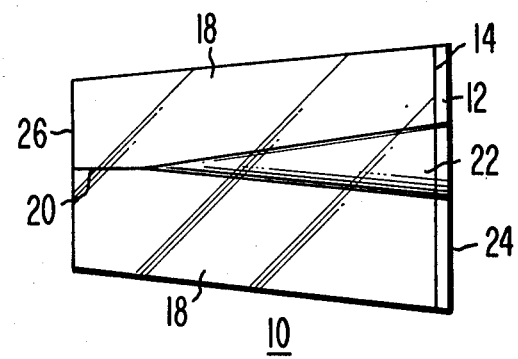
FIG. 2 is a bottom view of the curved bottom of the stylus tip in FIG. 1.

With reference to FIGS. 1 and 2, a video disc stylus 10 has a support structure 16 formed of dielectric material, such as sapphire. The illustrated tip of the support structure 16 has sides 18 extending from a rear face 14 in converging fashion toward the stylus front. The sides 18 meet at the bottom of the stylus front to there define a knife edge 20. Above the knife edge 20, the converging sides 18 terminate at the edges of the triangular front face 26 (not visible in the drawings). To the rear of the knife edge 20, the support structure bottom surface 22 is curved. The tapering rear face 14 of the support structure 16 has converging straight edges which terminate at the curved bottom edge 22.

A cermet film 12 is deposited on the portion of the support structure surface which forms the rear face 14. The cermet film 12 which overlies the face 14 also has converging straight edges which terminate in a curved bottom edge. The cermet film 12 is composed of a mixture of an electrically conductive material such as tungsten, chromium, tantalum, molybdenum, or hafnium and a dielectric material which has a high adherence to the support structure 16. Preferably the dielectric material is the same as in the support structure 16. The concentration of the constituent materials in the cermet film 12 vary through the film's thickness. The cermet film 12 at the interface with the support structure 16 has a relatively high concentration, 85 volume percent for example, of the dielectric material and a relatively low concentration of the conductive material. At the exposed surface 24 of the cermet film 12, the concentration of the conductive material is relatively high, up to 90 volume percent, and the concentration of the dielectric material is correspondingly low.

Since the cermet film 12 has a high initial concentration of the adherent dielectric material and a low conductive material concentration, good adherence exists between the cermet film 12 and the support structure 16, even through the conductive material, when deposited alone, may have poor adherence to the dielectric material of the support structure. As the thickness of the cermet film 12 increases, the metallic concentration also increases until the exposed surface 24 is formed almost entirely of the conducting material, producing an element of high conductivity suitable for use in a variable capacitance video disc playback system.

Figure 3:
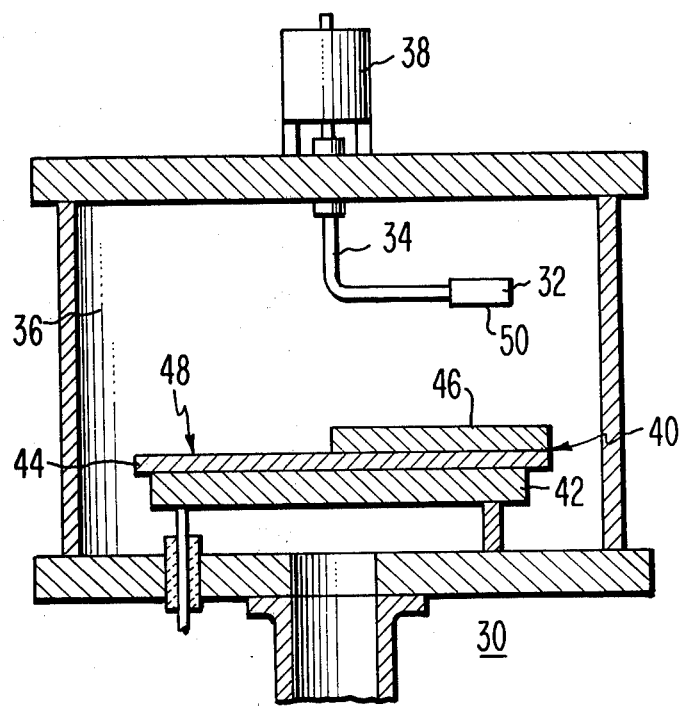
FIG. 3 is a sputtering apparatus which may be used to make the stylus in FIG. 1.

The above described stylus 10 may be produced using the following method. The cermet film 12 for the conducting element of the stylus is deposited in a radio frequency sputtering apparatus 30 as shown in FIG. 3. A disc shaped substrate 32, of dielectric material such as sapphire, is placed at one end of an L-shaped support 34 within the sputtering chamber 36. The other end of the L-shaped support 34 extends through the sputtering chamber wall and is connected to a rotor 38.

Figure 4:
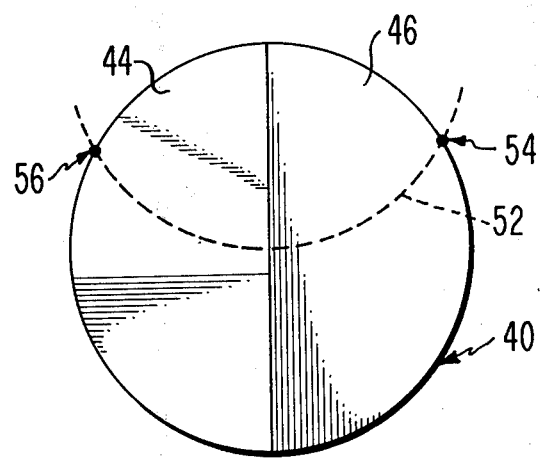
FIG. 4 is an example of a sputtering target for use in the apparatus in FIG. 3.

Also located within the sputtering chamber 36 is a composite sputtering target 40 mounted on the cathode 42 of the sputtering apparatus 30. The composite target 40 has a section of dielectric material which adheres well to the substrate 32, preferably the same material as the substrate, and a section of a conductive material. Each section serves as a separate source for a component material of the film to be deposited. The embodiment of the target shown in FIGS. 3 and 4 is a disc shaped sheet 44 of conductive material placed upon the cathode 42. A semicircular sheet 46 composed of the dielectric material is placed on the top surface 48 of the conductive material sheet 44 covering approximately one half of the top surface. A similar composite target may be formed with two semicircular sheets adjoining each other at the linear edges.

After the substrate 32 has been placed at the one end of the support 34, the substrate is positioned at a first point 54 which is over the outer edge of the semicircular dielectric sheet 46. The radio frequency sputtering apparatus is then activated causing the target material to leave the top surface, mainly in an upward direction, striking and adhering to the bottom surface of the substrate 32. The rotor 38 is then employed to move the substrate 32 in an arc 52 across the top surface of the target 40. Other patterns of movement such as a straight line may also be used. The substrate is moved until it reaches a second point 56 which is over the outer edge of the disc shaped conductive material sheet 44.

The relative concentration of the conductive and dielectric material in the sputtered material varies depending upon the position over target 40. The concentration of the conductive material is greater near the exposed surface of the disc shaped conductive material sheet 44. Likewise, the dielectric concentration is greater near the semicircular dielectric sheet 46. The concentration of the conductive material in the cermet film 50, therefore, varies depending upon the position of the substrate 32 over the target 40. For example, the concentration of the conductive material in the cermet film is relatively low at the first point 54 and relatively high at the second point 56. Between the first and the second points 54 and 56, the concentration of the conductive and dielectric materials in the deposited film varies from one extreme to the other.

The travel of the wafer 32 through the arc 52 from a first point 54 to the second point 56 deposits a cermet film onto the substrate 32 which varies from a relatively high initial concentration of the dielectric material to a relatively high concentration of the conductive material at the exposed surface 24 of the cermet film 50. This travel through the arc 52 may be continuous or stepped. The rate of the wafer travel is dependent upon the desired thickness and concentration gradient of the cermet film 50. The concentration gradient of the cermet film 50 may be varied by starting at different points along the arc 52 or by making an incomplete pass over the target 40.

The cermet film may be formed using other deposition apparatus, for example, an evaporator which has several evaporant sources. In this case the movement of the substrate with respect to the evaporant sources is similar to that in the sputtering method.

After the cermet film 50 has been deposited upon a portion of the surface of the substrate 32, the coated substrate is diced to form at least one parallelepiped unit. To form a stylus 10 from one of these diced units, a first rough lapping step shapes two opposed side surfaces of the unit to form the rear face 14 from the surface containing the cermet film. The converging sides 18 of the stylus tip are also formed during the rough lapping. With appropriate cocking of the unit during the rough lapping, the converging sides 18 form a knife edge 20 angled across one end of the unit. In a finish lapping step, a portion of the knife edge is removed and supplanted by a curved bottom edge 22, with the curve defining an arc of a circle and chosen to substantially match the curvature of a nondepressed region of the groove bottom of the disc to be played.

We claim:

1. A method for sputtering a layer in which the concentration of the component materials varies through the thickness of the layer, said method comprising the steps of:
   moving the substrate within a sputtering apparatus having sources of the different component materials, the substrate being moved during the deposition from a position where the deposition is substantially from a first source to at least one intermediate position where deposition is from said first source and at least another of said sources to a position where deposition is substantially from said another of said sources, so that the deposited layer varies in concentration through its thickness.
2. The method as in claim 8 wherein the moving of the substrate is continuous.
3. The method as in claim 1 wherein the moving of the substrate is in a stepped pattern.
4. The method as in claim 1 wherein the substrate is moved in an arc across the component material sources.
5. The method as in claim 1 wherein the substrate is moved in a straight line across the component material sources.
6. A method for making a video disc stylus comprising the steps of:
   placing a substrate formed of a dielectric material into the chamber of a radio frequency diode sputtering apparatus, the chamber containing a composite sputtering target having a section of the same conductive material and a section of dielectric material which comprises the substrate;
   activating the sputtering apparatus causing the materials of the sputtering target to sputter; and
   moving the substrate across the surface of the composite sputtering target from an initial position near the section of dielectric material to a position near the section of conductive material so that the sputtered material strikes and adheres to the substrate.
7. The method as in claim 6 wherein the forming of the tip comprises the steps of:
   dicing the substrate to form at least one parallelepiped unit;
   rough lapping two opposed sides of the diced unit to form a rear face on which the cermet film is deposited, and converging sides; and
   finish lapping the end of the diced unit to form a curved bottom edge.

* * * * *